(12) United States Patent
Lin

(10) Patent No.: US 7,630,252 B2
(45) Date of Patent: Dec. 8, 2009

(54) SYSTEMS FOR PROGRAMMING MULTILEVEL CELL NONVOLATILE MEMORY

(75) Inventor: Jason T. Lin, Santa Clara, CA (US)

(73) Assignee: SanDisk Corporation, Milpitas, CA (US)

( * ) Notice: Subject to any disclaimer, the term of this patent is extended or adjusted under 35 U.S.C. 154(b) by 178 days.

(21) Appl. No.: 11/767,611

(22) Filed: Jun. 25, 2007

(65) Prior Publication Data

US 2008/0316816 A1 Dec. 25, 2008

(51) Int. Cl.
*G11C 11/03* (2006.01)

(52) U.S. Cl. .......................... 365/185.24; 365/185.03; 365/185.17; 365/185.33

(58) Field of Classification Search ............ 365/185.24, 365/185.17, 185.33, 185.03
See application file for complete search history.

(56) References Cited

U.S. PATENT DOCUMENTS

| | | | |
|---|---|---|---|
| 5,671,388 A | 9/1997 | Hasbun | 395/430 |
| 5,867,429 A | 2/1999 | Chen et al. | 365/185.33 |
| 5,930,167 A | 7/1999 | Lee et al. | 365/185.03 |
| 7,046,548 B2 | 5/2006 | Cernea et al. | 365/185.03 |
| 7,061,798 B2 | 6/2006 | Chen et al. | 365/185.02 |
| 7,164,601 B2 | 1/2007 | Mitani et al. | 365/185.03 |
| 7,453,712 B2 * | 11/2008 | Kim et al. | 365/63 |
| 2008/0104309 A1 * | 5/2008 | Cheon et al. | 711/103 |
| 2008/0112221 A1 * | 5/2008 | Park et al. | 365/185.03 |
| 2008/0316815 A1 | 12/2008 | Lin | |

\* cited by examiner

*Primary Examiner*—Pho M. Luu
(74) *Attorney, Agent, or Firm*—Weaver Austin Villeneuve Sampson LLP

(57) ABSTRACT

A memory system includes a first block in which data is stored with a low density and a second block in which data is stored with a high density. When data is received it is written to the first block, and in parallel some of the data is written to the second block, so that the second block is partially programmed. The second block is later fully programmed by copying additional data from the first block.

18 Claims, 4 Drawing Sheets

FIG. 5

| | Even Page (BL) | | | Odd Page (BL) | | |
|---|---|---|---|---|---|---|
| | 1st Stage | 2nd Stage | 3rd Stage | 1st Stage | 2nd Stage | 3rd Stage |
| WL31 | [186] | [188] | [190] | [187] | [189] | [191] |
| ... | ... | ... | ... | ... | ... | ... |
| WL4 | [18] | | | [19] | | |
| WL3 | [12] 24,25 | [20] | | [13] 28,29 | [21] | |
| WL2 | [6] 16,17 | [14] 16,17,18,19 | [22] | [7] 20,21 | [15] 20,21,22,23 | [23] |
| WL1 | [2] 8,9 | [8] 8,9,10,11 | [16] 8,9,10,11 | [3] 12,13 | [9] 12,13,14,15 | [17] 12,13,14,15 |
| WL0 | [0] 0,1 | [4] 0,1,2,3 | [10] 0,1,2,3 | [1] 4,5 | [5] 4,5,6,7 | [11] 4,5,6,7 |

FIG. 6

| | Even Page (BL) | | | Odd Page (BL) | | |
|---|---|---|---|---|---|---|
| | 1st Stage | 2nd Stage | 3rd Stage | 1st Stage | 2nd Stage | 3rd Stage |
| WL31 | [62] | [186] | [190] | [63] | [187] | [191] |
| ... | ... | ... | ... | ... | ... | ... |
| WL4 | [8] | | | [9] | | |
| WL3 | [6] 24,25 | [74] | [76] | [7] 28,29 | [75] | [77] |
| WL2 | [4] 16,17 | [70] 16,17,18,19 | [72] 8,9,10,11 | [5] 20,21 | [71] 20,21,22,23 | [73] 12,13,14,15 |
| WL1 | [2] 8,9 | [66] 8,9,10,11 | [68] 0,1,2,3 | [3] 12,13 | [67] 12,13,14,15 | [69] 4,5,6,7 |
| WL0 | [0] 0,1 | [64] 0,1,2,3 | | [1] 4,5 | [65] 4,5,6,7 | |

SYSTEMS FOR PROGRAMMING MULTILEVEL CELL NONVOLATILE MEMORY

CROSS-REFERENCE TO RELATED APPLICATION

This application is related to U.S. patent application Ser. No. 11/767,605, filed on the same day as the present application, entitled, "Methods of Programming Multilevel Cell Nonvolatile Memory". This application is incorporated in its entirety by reference as if fully set forth herein.

BACKGROUND OF THE INVENTION

This invention relates to nonvolatile memory systems and methods of operating nonvolatile memory systems. In particular, this application relates to nonvolatile memory arrays in which floating gate memory cells individually hold one or more bits of data, and to methods of programming such memory arrays.

Nonvolatile memory systems are used in various applications. Some nonvolatile memory systems are embedded in a larger system such as a personal computer. Other nonvolatile memory systems are removably connected to a host system and may be interchanged between different host systems. Examples of such removable memory systems include memory cards and USB flash drives. Electronic circuit cards, including non-volatile memory cards, have been commercially implemented according to a number of well-known standards. Memory cards are used with personal computers, cellular telephones, personal digital assistants (PDAs), digital still cameras, digital movie cameras, portable audio players and other host electronic devices for the storage of large amounts of data. Such cards usually contain a re-programmable non-volatile semiconductor memory cell array along with a controller that controls and supports operation of the memory cell array and interfaces with a host to which the card is connected. Several of the same type of card may be interchanged in a host card slot designed to accept that type of card. However, the development of the many electronic card standards has created different types of cards that are incompatible with each other in various degrees. A card made according to one standard is usually not useable with a host designed to operate with a card of another standard. Memory card standards include PC Card, CompactFlash™ card (CF™ card), SmartMedia™ card, MultiMediaCard (MMC™), Secure Digital (SD) card, a miniSD™ card, Subscriber Identity Module (SIM), Memory Stick™, Memory Stick Duo card and microSD/TransFlash™ memory module standards. There are several USB flash drive products commercially available from SanDisk Corporation under its trademark "Cruzer®." USB flash drives are typically larger and shaped differently than the memory cards described above.

Different types of flash memory array architecture are used in nonvolatile memory systems. In one type of architecture, a NAND array, strings of more than two memory cells, such as 16 or 32, are connected along with one or more select transistors between individual bit lines and a reference potential to form columns of cells. Word lines extend across cells within a large number of these columns.

An individual flash memory cell may hold one bit of data in what is known as a Single Level Cell (SLC) memory. In some examples, a memory cell may hold two or more bits of data in what is known as a Multi Level Cell (MLC) memory.

SUMMARY OF THE INVENTION

A method of saving data in a nonvolatile memory array according to an embodiment of the present invention comprises: storing a plurality of addressable units of data in a first block that stores a first number of data bits per cell; in parallel with storing the plurality of addressable units of data in the first block, storing some, but not all, of the plurality of addressable units of data in a second block that stores a second number of data bits per cell, the second number being greater than the first number, thus partially programming individual cells of the second block; and subsequently further programming the partially programmed individual cells of the second block according to one or more of the plurality of addressable units of data stored in the first block.

A method of programming a nonvolatile memory having multi-level cells according to an embodiment of the present invention comprises: receiving a plurality of sequential units of data from a host, the plurality of sequential units of data comprising a first subset and a second subset; programming the first subset of the plurality of units of data to a first block, where cells are individually mapped to one of two logical states, and programming the first subset of the plurality of units of data to a second block, where cells are individually mapped to one of more than two logical states, thus partially programming individual cells of the second block, the programming to the first block and to the second block occurring in parallel; programming the second subset of the plurality of sequential units of data to the first block without programming the second subset of the plurality of sequential units of data to the second block in parallel; and subsequently further programming the second block according to at least one of the first subset of the plurality of units of data read from the first block and at least one of the second subset of the plurality of units of data read from the first block.

A method of programming a nonvolatile memory having multi-level cells according to an embodiment of the present invention, comprises: receiving a plurality of sequential sectors, the plurality of sequential sectors consisting of a first subset of sectors and a second subset of sectors; programming the first subset of the plurality of sectors to a first block, with cells of the first block individually programmed to one of two memory states, and programming the first subset of the plurality of sectors to a second block, with cells of the second block individually programmed to one of two memory states out of four available memory states, the programming of each sector of the first subset to the first block and to the second block occurring in parallel; programming a second subset of the plurality of sequential sectors to the first block without programming the second subset of the plurality of sequential sectors to the second block in parallel; and subsequently further programming the second block according to at least one of the first subset of the plurality of sectors read from the first block and at least one of the second subset of the plurality of sectors read from the first block.

A memory system according to an embodiment of the present invention comprises: a first block that has only two memory states per cell; a second block that has more than two memory states per cell; and a circuit that programs a sequence of data to the first block and in parallel programs first portions, but not second portions, of the sequence of data to the second block, thus partially programming individual cells of the second block, and subsequently further programs the cells of the second block according to the second portions of the sequence of data that are stored in the first block.

A nonvolatile memory system according to an embodiment comprises: a first block that includes a first plurality of cells, each of the first plurality of cells having a threshold voltage range that is mapped to two memory states; a second block that includes a second plurality of cells, each of the second plurality of cells having a threshold voltage range that is mapped to a plurality of memory states, the plurality of memory states including more than two memory states; and a circuit that programs a sequence of data, consisting of first portions of data and second portions of data, to the first block and in parallel programs the first portions, but not the second portions of the sequence of data to the second block such that the second plurality of cells are programmed to fewer than all of the plurality of memory states, the circuit subsequently further programming the second plurality of cells according to the first portions and the second portions of data stored in the first block, the second plurality of cells programmed to all of the plurality of memory states by the further programming.

BRIEF DESCRIPTION OF THE DRAWINGS

FIG. 5 shows a programming scheme for an MLC block that stores four bits per cell, the scheme programming odd bit lines and even bit lines separately, in three stages each.

FIG. 6 shows an alternative programming scheme for an MLC block.

DETAILED DESCRIPTION OF ILLUSTRATED EMBODIMENTS

Figure 1:
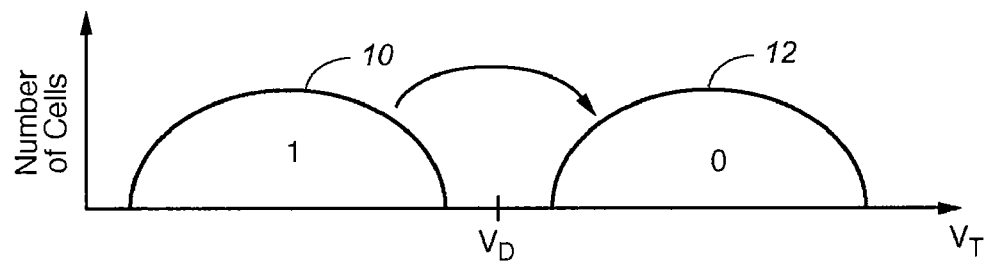
FIG. 1 shows programming of an SLC memory.

It is common in current commercial products for each storage element of a flash EEPROM array to store a single bit of data by operating in a binary mode, where two ranges of threshold voltage of the storage element transistors are defined as two memory states. The threshold voltage of transistors correspond to ranges of charge levels stored on their storage elements. In addition to shrinking the size of the memory arrays, the trend is to further increase the density of data storage of such memory arrays by storing more than one bit of data in each storage element transistor. This is accomplished by defining more than two threshold voltage levels as memory states for each storage element transistor, four such states (2 bits of data per storage element) being used in one example. More storage states, such as 16 states (4 data bits) per storage element may also be used. Each storage element memory transistor has a certain total range (window) of threshold voltages in which it may practically be operated, and that range is divided into the number of states defined for it plus margins between the states to allow for them to be clearly differentiated from one another.

As the number of states stored in each memory cell increases, the tolerance of any shifts in the programmed charge level on the storage elements decreases. Since the ranges of charge designated for each memory state must necessarily be made narrower and placed closer together as the number of states stored on each memory cell storage element increases, the programming must be performed with an increased degree of precision and the extent of any post-programming shifts in the stored charge levels that can be tolerated, either actual or apparent shifts, is reduced. Actual disturbs to the charge stored in one cell can be created when programming and reading that cell, and when reading, programming and erasing other cells that have some degree of electrical coupling with that cell, such as those in the same column or row, and those sharing a line or node.

Apparent shifts in the stored charge levels occur because of field coupling between storage elements. The degree of this coupling is necessarily increasing as the spaces between memory cell storage elements are being decreased, which is occurring as the result of improvements of integrated circuit manufacturing techniques. The problem occurs most pronouncedly between two groups of adjacent cells that have been programmed at different times. One group of cells is programmed to add a level of charge to their storage elements that corresponds to one set of data. After the second group of cells is programmed with a second set of data, the charge levels read from the storage elements of the first group of cells often appear to be different than programmed because of the effect of the charge on the second group of storage elements being capacitively coupled with the first. This is known as the Yupin effect, and is described in U.S. Pat. No. 5,867,429. This patent describes either physically isolating the two groups of storage elements from each other, or taking into account the effect of the charge on the second group of storage elements when reading that of the first group. Various programming schemes may be used to reduce Yupin effect. In particular, programming of MLC memory may be done in stages, a first stage is performed to bring a group of memory cells close to their desired charge levels. Then, only after neighboring cells have undergone at least a first stage, a second stage is performed to bring the cells to their desired levels. Thus, the final charge levels reflect changes caused by programming of neighboring cells.

Because of the higher precision required in programming MLC memory, more time is generally needed than for programming SLC memory. Also, programming in multiple steps to reduce apparent shifts in charge levels may take more time. This means that MLC storage, though more efficient in using space in a memory array, may be slower than SLC memory, at least for programming. In order to take advantage of the storage efficiency of MLC memory and the speed of SLC memory, data may initially be written to SLC memory and later copied to MLC memory. Once all data from an SLC block is copied to an MLC block, the SLC block may be erased so that it becomes available for subsequent use.

FIG. 1 shows programming of a SLC memory. The threshold voltage ($V_T$) of a cell is mapped to two distinct ranges representing two memory states and threshold voltages of individual cells are represented by distributions 10, 12 shown for logical state 1 and logical state 0 respectively. An erased memory cell represents a logic 1 state. A programmed cell represents a logic 0 state. Generally, memory cells are erased together in a unit of a block (erase block) so that all cells in the block are brought to the logic 1 state together. Cells are generally programmed together in units of a page, where a block consists of one or more pages. In one example, a NAND flash memory consists of blocks of cells, with each block consisting of multiple pages that are formed by rows of memory cells. Examples of NAND flash memory systems and their operation are provided in U.S. Pat. No. 7,061,798. During programming, cells that are to hold a logical 0 have their threshold voltage increased as shown, while cells that are to hold a logical 1 remain at their erased threshold voltage. Programming may include a series of pulse and verify steps. Once the cells are programmed, the state of a cell is read by comparing the threshold voltage of the cell to a discrimination voltage ($V_D$). Thus, any cell having a threshold voltage less than $V_D$ is read as storing a 1, and any cell having a threshold voltage greater than $V_D$ is read as storing a 0.

Figure 2A:
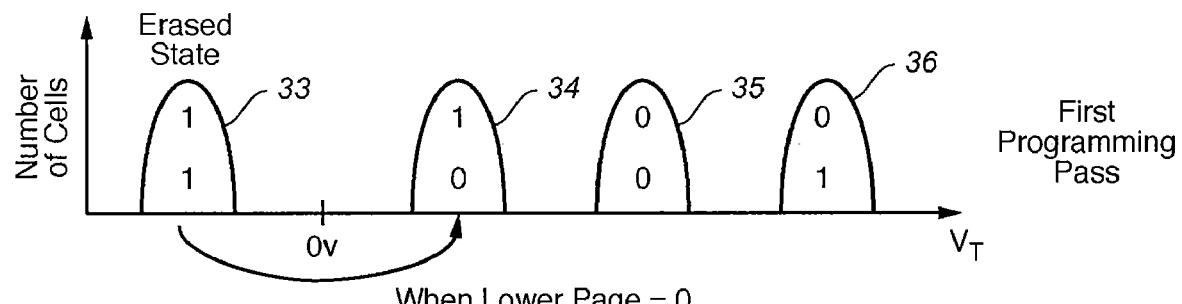
FIG. 2A shows a first stage of programming an MLC memory.

FIG. 2A shows a first stage of programming MLC memory. In particular, FIG. 2A shows the threshold voltage of a cell having four different threshold voltage ranges assigned to four different memory states 33-36. The erased state 33 has the lowest threshold voltage range, indicated by a threshold voltage less than 0 volts in this example. The first programming stage of FIG. 2A programs some cells to the next state, state 34 and leaves others in erased state 33. This programming stage (first pass) generally programs cells of a page of memory together and the bits programmed in this way may be considered as a logical page (lower page). Thus, after the first pass programming of FIG. 2A a first logical page has been programmed and all cells of the physical page in the memory array are either in the erased state 33 or first programmed state 34. Programming may be achieved by a series of programming pulses with verification performed between pulses.

Figure 2B:
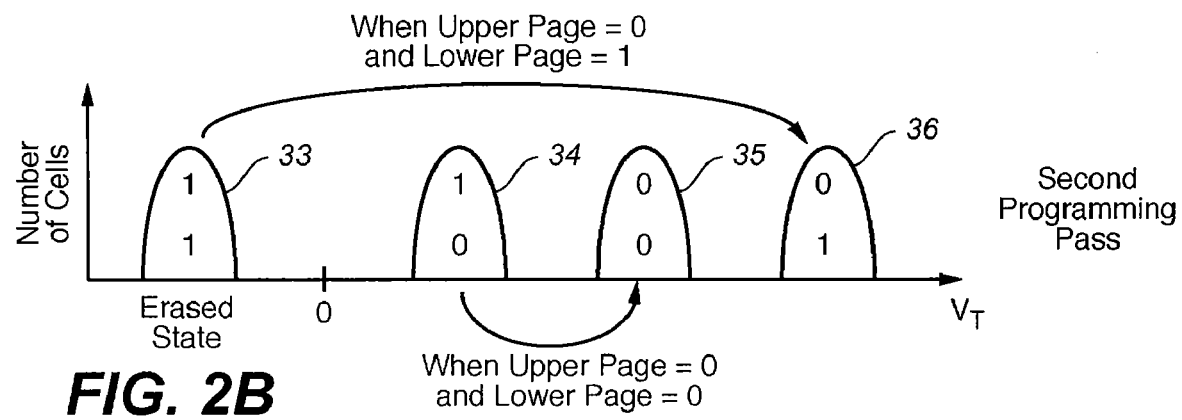
FIG. 2B shows a subsequent second stage of programming the MLC memory of FIG. 2A.

FIG. 2B shows a second programming stage (second pass) that is performed subsequent to the first stage of FIG. 2A. In this stage, cells are programmed according to bits of a second logical page (upper page). For cells storing a 1 in the upper page, the memory state remains in erased state 33 or first programmed state 34. For cells storing a 0 in the upper page, the memory state is programmed to second programmed state 35 or third programmed state 36 as shown. Cells in erased state 33 are programmed to third programmed state 36 and cells in first programmed state 34 are programmed to second programmed state 35 as shown. Thus, after the second programming stage, a cell may be in any one of four possible memory states as determined by an upper page bit and a lower page bit as indicated by bits shown in distributions of cells in states 33-36. It will be understood that FIGS. 2A and 2B show an exemplary scheme and other schemes may also be used to program MLC memory.

While storing larger amounts of data per unit area in a memory array is achievable using MLC as compared with SLC, reducing the speed of programming is generally not desirable and may not be acceptable for certain applications. In particular, for removable mass storage applications (e.g. in flash memory cards or USB flash drives), hosts may require data to be stored within a specified maximum time. In order to take advantage of the storage efficiency of MLC without suffering a time penalty, data may initially be stored in SLC and later stored in MLC at a time when resources are available, e.g. data may be moved to MLC as a background operation. When the data is stored in SLC, an indication may be sent to the host indicating that the data is stored. Thus, the host sees data storage taking place at the speed of SLC storage. Subsequent storage in MLC may be transparent to the host. As long as transfer of data from SLC memory to MLC memory takes place in a timely manner, the extra space occupied by data in SLC memory may not have a significant impact.

Figure 3A:
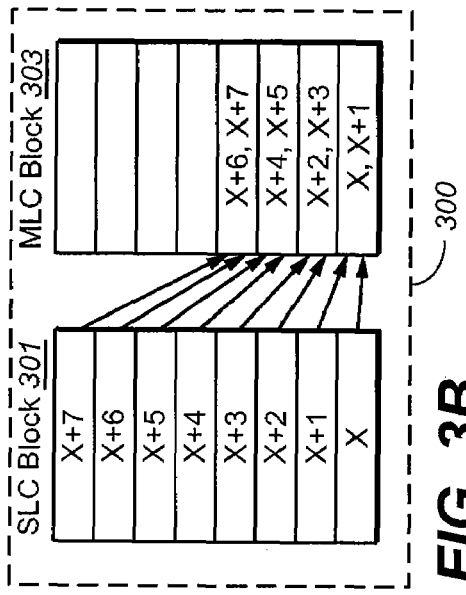
FIG. 3A shows data being initially programmed to an SLC block in a memory system that also includes an MLC block.
Figure 3B:
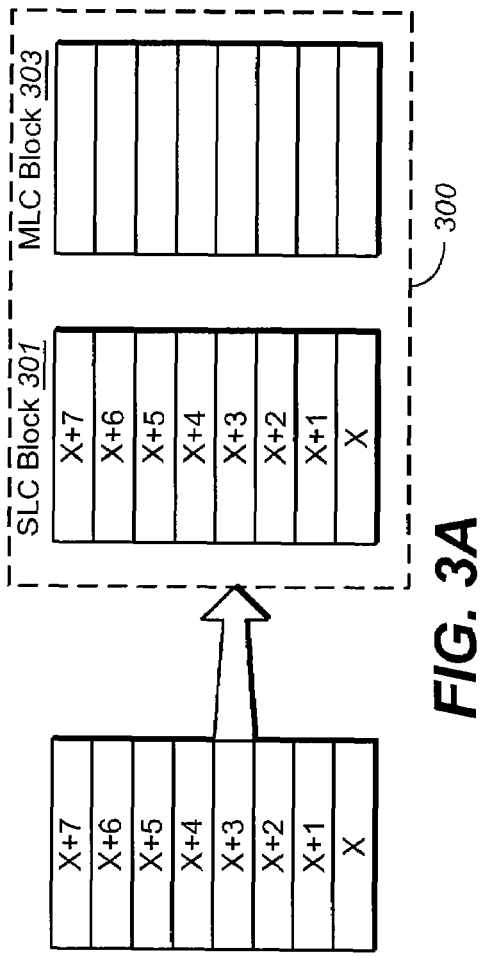
FIG. 3B shows the data that was programmed to the SLC block of FIG. 3A being copied to the MLC block.

FIG. 3A shows an example of a sequence of sectors of data X to X+7 that are received by a memory system 300 which contains an SLC block 301 and an MLC block 303. This example uses SLC and two-bit MLC, but it will be understood that the scheme described may apply to any two different storage densities. The sequence of sectors are written to the SLC block 301 as shown. Subsequently, the sequence of sectors is copied to the MLC block 303 as shown in FIG. 3B. FIG. 3B indicates one sector being stored in each page of the SLC block 301 and two sectors being stored in each page of the MLC block 303. In other examples, a page of SLC may contain more than one sector of data and a page of MLC may contain more than twice as much as a page of SLC. In the example of FIG. 3B, data from two SLC blocks may be copied to one MLC block so that each such operation frees one additional block for reuse.

Figure 3C:
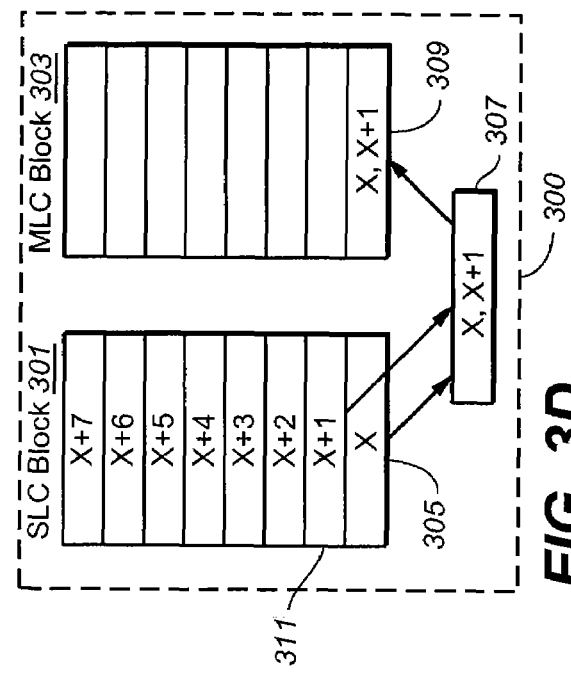
FIG. 3C shows data of a first page of the SLC block being copied from the SLC block to the MLC block where it forms a first logical page of data.
Figure 3D:
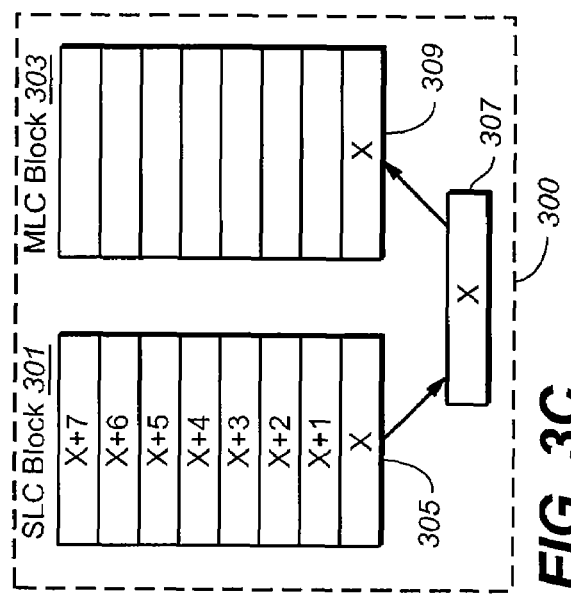
FIG. 3D shows data of a second page of the SLC block being copied from the SLC block to the MLC block where it forms a second logical page that is stored with the first logical page in a physical page of the MLC block.

FIGS. 3C and 3D show additional detail of the copying of data from the SLC block 301 to the MLC block 303 of FIG. 3B. In particular, FIG. 3C shows sector X being copied from a physical page 305 of the SLC block 301 to a register 307 from which sector X is written to a physical page 309 of the MLC block 303 in a first stage of programming the page of the MLC block. Sector X forms a lower logical page in the physical page 309.

FIG. 3D shows a subsequent, second stage of programming the page of the MLC block. Data of sector X and sector X+1 are read from pages 305 and 311 respectively in SLC block 301 into register 307. While sector X could be read from the MLC block 303 instead of the SLC block 301 in this step, generally it is preferable to read sector X from the SLC block 301 because it is less likely to contain errors. Physical page 309 of MLC block 303 is then programmed according to the data of sectors X and X+1 in register 309 in a second programming stage. In the example shown, a single data register (register 309) is used to read data from SLC and program the data to MLC. In other examples, data may be transferred between different data registers as part of such a copying operation.

The operation described above in FIGS. 3A-3D writes data rapidly and ultimately stores the data in an efficient manner. However, problems may arise where the memory system does not have sufficient time to keep up with copying data from SLC blocks to MLC blocks. In some memory systems, an individual block may be operated as either an SLC block or an MLC block. An individual block may operate as an SLC block at one time and subsequently (after erase) may be operated as an MLC block. If such a memory does not have sufficient time to copy data from SLC blocks to MLC blocks then a large number of blocks may be occupied with data stored in SLC form. This reduces the capacity of the memory and the memory may become full (no erased blocks available) even though it stores less data than its nominal capacity. In other memory systems, there may be a fixed number of SLC blocks and a fixed number of MLC blocks. If the memory system does not copy data from SLC blocks to MLC blocks fast enough, all SLC blocks may be occupied and subsequently data may not be written at sufficiently high speed, causing a time out error to occur.

Figure 4A:
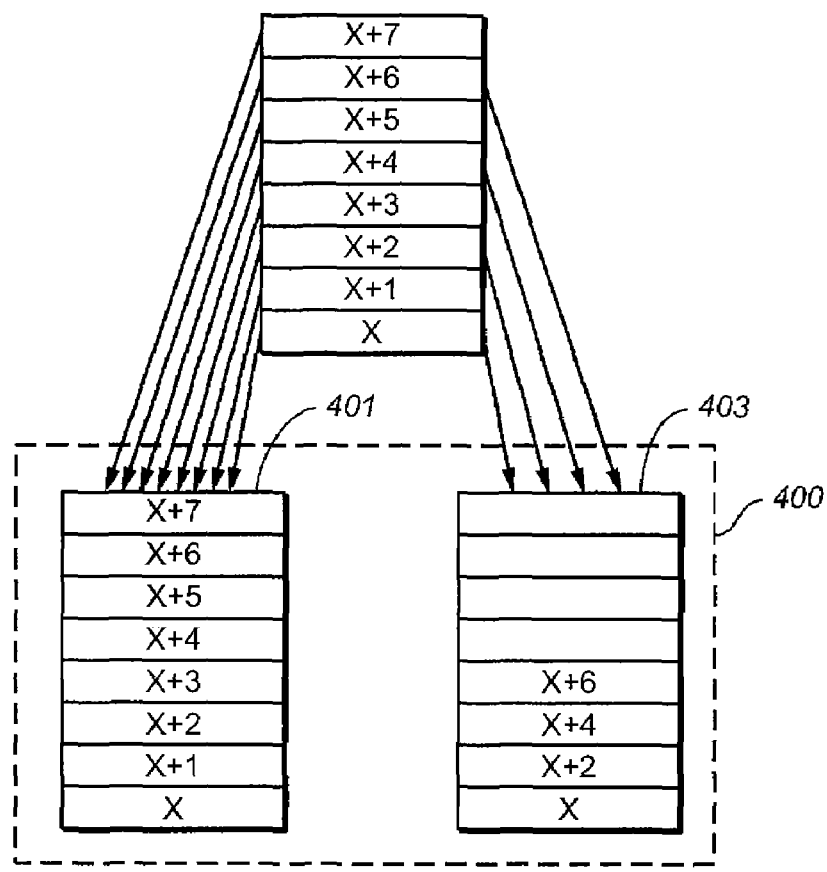
FIG. 4A shows an example of data being programmed to an SLC block, a portion of the data being programmed to an MLC block in parallel.

FIG. 4A shows a first stage of an alternative programming scheme to that of FIGS. 3A-3D. In this stage, a group of sequential sectors of data X to X+7 are received by memory system 400. Sectors X to X+7 are written to SLC block 401 as before, but in addition some of the sectors are written to the MLC block 403 in parallel with writing them to the SLC block 401. In the present example, alternate sectors X, X+2, X+4, X+6 are written to the MLC block 403 in parallel with writing to the SLC block 401. Programming of sector X to MLC block 403 may take longer than programming sector X to SLC block 401 because of the higher resolution needed. However, this does not adversely affect overall write time because programming sector X to MLC block 403 may continue while sector X+1 is programmed to SLC block 401. Similarly, programming of sector X+2 to MLC block 403 may occur in parallel with programming of sector X+2 to SLC block 401 and may continue as sector X+3 is programmed to SLC block 401. The programming of sector X to the MLC block is similar to the first stage programming of the MLC block 403 shown in FIG. 3C. As a result of the parallel programming of FIG. 4A a first stage programming is performed for multiple pages in the MLC block 403 within the time that sectors X to X+7 are written to the SLC block 401.

Figure 4B:
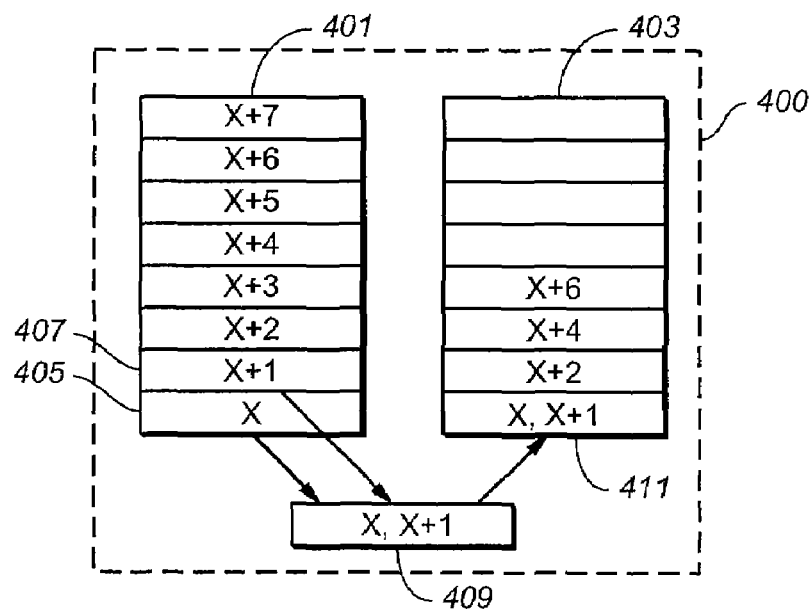
FIG. 4B shows copying of data from the SLC block to the MLC block subsequent to the parallel programming of FIG. 4A.

Subsequently a further programming step is performed to program all sectors X to X+7 into the MLC block 403. FIG. 4B shows sectors X and X+1 being read from physical pages 405, 407 respectively in SLC block 401 into a data register 409. Sectors X and X+1 are then used to further program first page 411 of the MLC block 403. Thus, the step shown in 4B corresponds to that of FIG. 3D. One advantage of the scheme of FIGS. 4A and 4B is that first stage programming of pages of MLC block 403 is done in parallel with programming of pages of SLC block 401 with little or no time penalty. Then, only the second stage programming of pages of MLC blocks 403 remains to be completed as a background operation so the time required for background operations is reduced. This means that the time during which the memory is unavailable to the host is reduced and the memory system's ability to keep up with copying of data from SLC memory to MLC memory is improved compared with the scheme of FIGS. 3A-3D.

While the above example deals with a relatively simple case of an SLC block and an MLC block that holds two bits per cell, the principles described may be applied to other systems where a memory writes data with different densities (different numbers of bits per cell). In general, where data is written with lower density for speed purposes but is ultimately stored with higher density for storage efficiency, it is advantageous to partially program some data in a high density format in parallel with initial low density programming so that later programming of all data in a high density format may be more rapidly completed. These principles may be applied to memory systems that include memory portions that are configurable for either high density storage or low density storage of data (e.g. blocks that are configurable to store different numbers of bits per cell). These principles may also be applied to memory systems where portions of memory are permanently configured as either low density or high density (e.g. low density blocks and high density blocks). Such permanently configured portions may be on the same die or different dies, on the same chip or on different chips. In one example, blocks are configurable as either low density or high density and data is initially written to a low density block, with some of the data written to a high density block in parallel. The low density block and high density block may be selected from the same plane within the memory (i.e. the blocks share read/write circuits and bit lines). Later, data is copied from the low density block to the high density block in the same plane. Such copying within the same plane is generally quicker and simpler than copying between blocks of different planes.

In some memory systems, memory cells are programmed in multiple stages. In particular, cells may undergo initial coarse programming to bring cells to approximately their desired threshold voltage ranges. Subsequently, after neighboring cells have undergone at lest a first stage programming, the cells may undergo fine programming to bring cells to their desired threshold voltage ranges, where each threshold voltage range reflects not only the charge on the corresponding floating gate but also the effect of charges on neighboring floating gates. Fine programming may be performed after all logical pages of data are programmed to a given physical page. Thus, earlier programming stages may program different logical pages of data and later programming stages may be fine programming stages that adjust for programming of neighboring cells. Fine programming may also occur after neighboring pages have been at least partially programmed.

In some memory designs, certain programming and reading circuits may be shared between bit lines to save space. For example, neighboring bit lines may share programming circuits and only one of the neighboring bit lines is used to program at a time. For example, odd numbered bit lines may be connected to programming circuits at one time and even numbered bit lines may be connected to the same programming circuits at another time. Other arrangements for sharing peripheral circuits may also be used. This means that odd numbered cells along a row may be programmed as a page, with even numbered cells along a row programmed as another page.

FIG. 5 shows a table for a programming scheme for programming data to an MLC block which stores four bits of data in each memory cell. The block uses programming circuits that are shared by alternate bit lines so that cells connected to even and odd bit lines are separately programmed and are considered as separate pages (even page and odd page). A physical page in this memory extends along a word line and there are 32 word lines extending through the block. Thus, there are a total of 64 pages (even and odd pages for each of 32 word lines) in the block. Each physical page stores four logical pages of data (i.e. four bits per cell). A logical page of data may consist of one or more (e.g. four) sectors of data, where a sector consists of 512 bytes of user data plus some overhead data. Each page is programmed in three stages as indicated by "$1^{st}$ Stage," "$2^{nd}$ Stage" and "$3^{rd}$ Stage" columns. In the first stage, first and second logical pages of data are programmed to a physical page in the MLC block. In the second stage, a third and fourth logical page of data are programmed to the physical page. The third stage is a fine programming stage to adjust for programming of neighboring cells. The order of programming stages is indicated by a stage number in brackets, with the logical pages that are programmed in each step listed after the stage number.

In step [0], logical pages 0 and 1 are programmed in a first stage programming of the even page of word line (WL) 0. Then, in step [1], logical pages 4 and 5 are programmed in a first stage programming of the odd page of WL 0. Then, in step [2], logical pages 8 and 9 are programmed to the even page of WL1. Then, in step [3], logical pages 12 and 13 are programmed to the odd page of WL1. Then, in step [4], logical pages 0-3 are programmed in a second stage programming to the even page of WL0. Step [5] is another second stage programming. Thus, second stage programming of data begins before first stage programming of all data is completed. Also, as shown in FIG. 5, third stage programming (fine programming) of data begins at step [10], which is relatively early in the programming of the MLC block (there are 192 steps in total). Generally, second stage and third stage programming takes longer than first stage programming and involves filling the programmed pages with data. Such a scheme may not be optimal for programming in parallel with SLC because the order requires performing second and third stage programming (which are time consuming) before all first stage programming is performed.

FIG. 6 shows an alternative scheme that is suitable for programming an MLC block in parallel with programming an SLC block as data is received from a host. In particular, the scheme of FIG. 6 shows all first stage programming being completed before any second or third stage programming is performed. Programming steps [0]-[63] are all first stage programming steps and are performed prior to any second stage programming. Subsequently, second and third stage programming (steps [64]-[191]) are performed. Thus, in this scheme, programming steps [0]-[63] program two logical pages of data to each physical page. Programming steps [0]-[63] may be performed in parallel with programming of another block with lower data density (e.g. SLC or MLC with less than four bits per cell). For example, steps [0]-[63] may be performed as data is received and as it is stored in SLC. Generally, such data is stored in SLC according to the sequence indicated by the logical page numbers, i.e. logical page 0, 1, 2, 3, 4 . . . . This provides time to store logical pages 0 and 1 in MLC during storage of logical pages 0, 1, 2 and 3 in SLC. Subsequently steps [64]-[191] may be performed as background operations that copy data stored in SLC.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to certain preferred embodiments, it is understood that the invention is entitled to protection within the full scope of the appended claims.

What is claimed is:

1. A memory system comprising:
   a first block that has only two memory states per cell;
   a second block that has more than two memory states per cell; and
   a circuit that programs a sequence of data to the first block and in parallel programs first portions, but not second portions, of the sequence of data to the second block, thus partially programming individual cells of the second block, and subsequently further programs the cells of the second block according to the second portions of the sequence of data that are stored in the first block.

2. The memory system of claim 1 wherein the second block has sixteen memory states per cell.

3. The memory system of claim 2 wherein the programming of first portions of the sequence of data to the second block uses four of the sixteen states per cell.

4. The memory system of claim 1 wherein the first block and the second block include strings of floating gate memory cells connected in series to form NAND strings.

5. The memory system of claim 4 wherein NAND strings are connected by bit lines alternate bit lines programmed together.

6. The memory system of claim 1 wherein the first block and the second block are connected by common bit lines.

7. The memory system of claim 1 wherein the first block is on a first die and the second block is on a second die.

8. The memory system of claim 7 wherein the first die has blocks of cells that have threshold voltage ranges that are mapped to the plurality of memory states and the second die has blocks of cells that have threshold voltage ranges that are mapped to only two memory states.

9. The memory system of claim 1 wherein the first block is on a first chip and the second block is on a second chip.

10. A nonvolatile memory system comprising:
    a first block that includes a first plurality of cells, each of the first plurality of cells having a threshold voltage range that is mapped to two memory states;
    a second block that includes a second plurality of cells, each of the second plurality of cells having a threshold voltage range that is mapped to a plurality of memory states, the plurality of memory states including more than two memory states; and
    a circuit that programs a sequence of data, consisting of first portions of data and second portions of data, to the first block and in parallel programs the first portions, but not the second portions of the sequence of data to the second block such that the second plurality of cells are programmed to fewer than all of the plurality of memory states, the circuit subsequently further programming the second plurality of cells according to the first portions and the second portions of data stored in the first block, the second plurality of cells programmed to all of the plurality of memory states by the further programming.

11. The nonvolatile memory system of claim 10 wherein the plurality of memory states consists of sixteen memory states.

12. The nonvolatile memory system of claim 11 wherein the fewer than all of the plurality of memory states consists of four memory states, the four memory states associated with lower portions of the threshold voltage range than are associated with other ones of the plurality of memory states.

13. The nonvolatile memory system of claim 10 wherein, subsequent to the further programming, additional programming steps are performed, the additional programming steps compensating for effects of charge in neighboring memory cells.

14. A memory system comprising:
    a first block that has only two memory states per cell, the first block on a first die, the first die having blocks of cells that have threshold voltage ranges that are mapped to more than two memory states per cell;
    a second block that has more than two memory states per cell, the second block on a second die; and
    a circuit that programs a sequence of data to the first block and in parallel programs first portions, but not second portions, of the sequence of data to the second block, thus partially programming individual cells of the second block, and subsequently further programs the cells of the second block according to the second portions of the sequence of data that are stored in the first block.

15. The memory system of claim 14 wherein the second die has blocks of cells that have threshold voltage ranges that are mapped to only two memory states.

16. The memory system of claim 14 wherein the first block and the second block include strings of floating gate memory cells connected in series to form NAND strings.

17. The memory system of claim 14 wherein the memory system is in a flash memory card or USB flash drive.

18. The memory system of claim 14 wherein all blocks are configurable as having two memory states per cell or more than two memory states per cell.

* * * * *